(12) United States Patent
Koshimizu

(10) Patent No.: US 6,214,162 B1
(45) Date of Patent: *Apr. 10, 2001

(54) PLASMA PROCESSING APPARATUS

(75) Inventor: Chishio Koshimizu, Kitakoma-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/342,213

(22) Filed: Jun. 29, 1999

Related U.S. Application Data

(63) Continuation-in-part of application No. 08/921,715, filed on Sep. 2, 1997, now Pat. No. 5,935,373.

(30) Foreign Application Priority Data

Sep. 27, 1996 (JP) .................................................. 8-277370

(51) Int. Cl.⁷ .................................................. H05H 1/00
(52) U.S. Cl. ................ 156/345; 118/723 I; 204/298.08; 204/298.34
(58) Field of Search ........................ 156/345; 118/723 R, 118/723 E, 723 I; 204/298.08, 298.34

(56) References Cited

U.S. PATENT DOCUMENTS

| | | | |
|---|---|---|---|
| 5,614,060 | 3/1997 | Hanawa | 438/720 |
| 5,683,538 | 11/1997 | O'Neill et al. | 156/345 |
| 5,685,942 | 11/1997 | Ishii | 156/345 |
| 5,824,606 | 10/1998 | Dible et al. | 438/729 |
| 5,935,373 | * 8/1999 | Koshimizu | 156/345 |

FOREIGN PATENT DOCUMENTS

| | | |
|---|---|---|
| 0 379 828 A2 | 8/1990 | (EP) . |
| 1-149965 | 6/1989 | (JP) . |
| 6-280029 | 10/1994 | (JP) . |
| 6-314660 | 11/1994 | (JP) . |
| 7-122399 | 5/1995 | (JP) . |
| 7-142453 | 6/1995 | (JP) . |
| 10-107012 | 4/1998 | (JP) . |

* cited by examiner

Primary Examiner—Gregory Mills
Assistant Examiner—Alva C Powell
(74) Attorney, Agent, or Firm—Oblon, Spivak, McClelland, Maier & Neustadt, P.C.

(57) ABSTRACT

This invention relates to a plasma generating apparatus having a plasma generating electrode, and improves the controllability of the etching selectivity and the etching shape. In a plasma processing apparatus, an electrode is located in a processing chamber. A plasma generating RF power is supplied from a plasma generating RF power supply to the electrode. A to-be-processed object W is mounted on a lower electrode located in the processing chamber. RF powers having their phases adjusted to predetermined values are applied to the plasma generating electrode and the lower electrode. RF powers of a continuous wave or RF power pulse trains can be used as the RF powers.

9 Claims, 4 Drawing Sheets

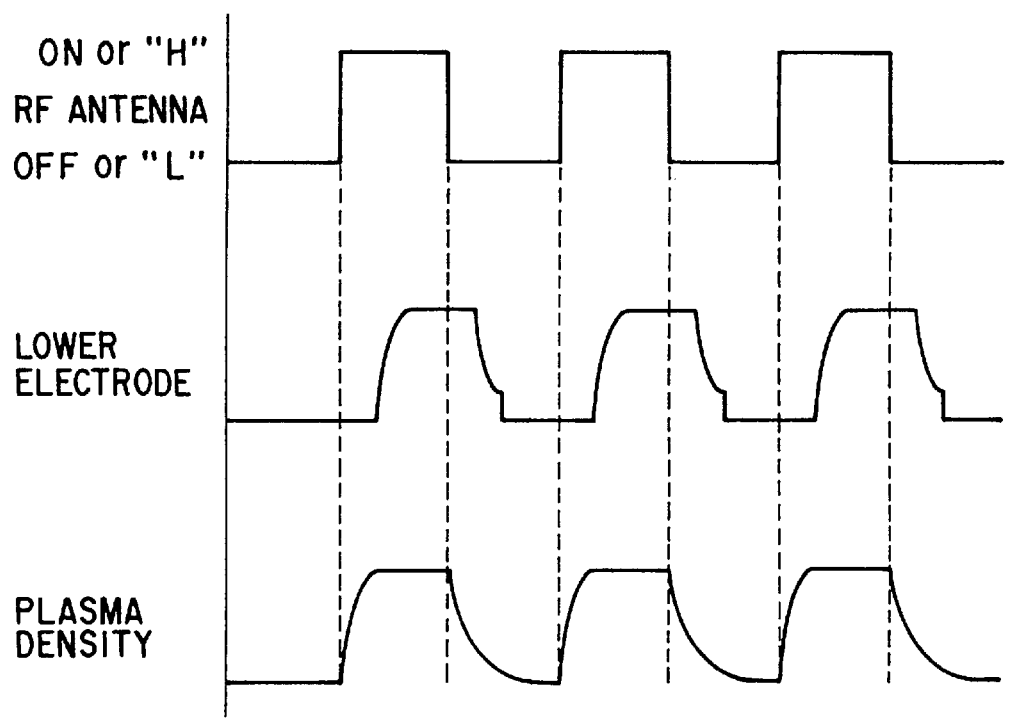
F I G. 3A
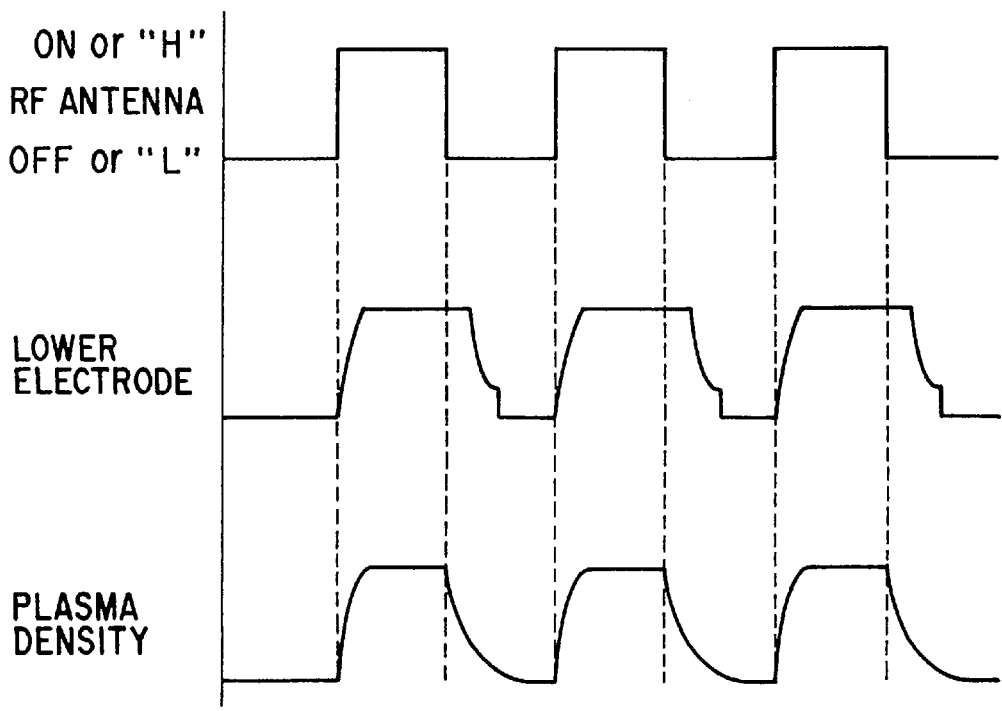
F I G. 3B

PLASMA PROCESSING APPARATUS

CROSS-REFERENCE TO RELATED APPLICATIONS

This is a Continuation-in-Part application of U.S. patent application Ser. No. 08/921,715, filed Sep. 2, 1997, now U.S. Pat. No. 5,935,373 the entire contents of which are incorporated herein by reference.

BACKGROUND OF THE INVENTION

The present invention relates to various plasma processing apparatuses such as a plasma etching apparatus, an ashing apparatus, a film formation apparatus, and a sputtering apparatus and, more particularly, to a plasma processing apparatus excellent in terms of an improvement in uniformity of a plasma generated in the plasma processing apparatus, an increase in plasma generation efficiency, an increase in processing precision, a reduction in damage to a substrate, and the like.

Known plasma processing apparatuses are apparatuses for performing various processes such as ashing, etching, CVD processing, and sputtering in an apparatus of manufacturing a semiconductor integrated circuit. In these apparatuses, a high frequency (RF) induction plasma generation apparatus using a coiled antenna is known as an apparatus for generating a plasma. Further, a plasma processing apparatus is also known, which has a plasma generating electrode (e.g. a parallel plate electrode) installed in its plasma processing chamber.

An example of this RF induction plasma generation apparatus is disclosed in European Pat. Appln. KOKAI No. 379828. The RF induction plasma generation apparatus disclosed in European Pat. Appln. KOKAI No. 379828 has a wall opposing a wafer susceptor consisting of an insulator such as silica glass, and a coiled antenna fixed on the outer surface of the insulator wall. A processing gas is ionized by an RF electromagnetic field formed by flowing an RF current through this antenna, thereby generating a plasma.

An antenna division type RF induction plasma generation apparatus is also disclosed in European Pat. Appln. KOKAI No. 379828. In this antenna division type RF induction plasma generation apparatus, the antenna is constituted by two set of coiled antennas in order to precisely control, over a wide range, a generation region where a plasma is generated. An RF power is applied to each antenna.

This RF induction plasma generation apparatus is used as an apparatus for a charge elimination process of eliminating the charge of a jack, a cleaning process of cleaning the wall of a chamber, an etching process, and the like.

In addition, a parallel plate plasma processing system is known as an example of the plasma processing apparatus having a plasma generating electrode installed in the plasma processing chamber. In this parallel plate plasma processing system, two plate electrodes are opposed in the plasma processing or reaction chamber. One of the plate electrodes has a heater or a cooling line contained therein, and is disposed to mount thereon a to-be-processed object. An RF power is applied between the opposed two plate electrodes, thereby generating plasma of a reactive gas therebetween, which is to be used to, for example, etch the to-be-processed object.

The plasma processing apparatus of the antenna division RF induction type has a technical problem that the plasma is difficult to uniformly generate, and another technical problem that hunting occurs between the divided antennas. In addition, the etching selectivity and the etching shape must be controlled.

The plasma processing apparatus of the parallel plate electrode structure also has technical problems such as the difficulty of plasma's uniform generation, the occurrence of hunting between the electrodes, etc. Moreover, also in this case, the etching selectivity and the etching shape must be controlled.

BRIEF SUMMARY OF THE INVENTION

It is an object of the present invention to solve or reduce the above problems of the conventional plasma processing apparatus of the parallel plate electrode structure.

It is another object of the present invention to improve the uniformity of a plasma to be generated.

It is still another object of the present invention to prevent the occurrence of hunting between a plurality of electrodes.

It is still another object of the present invention to increase the plasma generation efficiency.

It is still another object of the present invention to enable the control of the etching selectivity and the control of the etching shape when plasma etching is performed by the plasma processing apparatus.

It is still another object of the present invention to control the plasma generation region so as to clean an arbitrary region and shorten the cleaning time, when the chamber of the plasma processing apparatus is cleaned with plasma.

According to a first aspect of the invention, there is provided a plasma processing apparatus comprising:

- a plasma processing chamber;
- a plasma generating electrode located in the plasma processing chamber;
- a phase detecting circuit for detecting a phase of a high frequency power to be supplied to the plasma generating electrode;
- a plasma generation high frequency power supply unit for supplying a plasma generating high frequency power to the plasma generating electrode, the plasma generation high frequency power supply unit having a phase controller for controlling the phase of the high frequency power supplied to the plasma generating electrode;
- a lower electrode located in the processing chamber for mounting thereon a to-be-processed object; and
- a bias high frequency power supply unit for supplying a biasing high frequency power to the lower electrode, the bias high frequency power supply unit having a phase controller for controlling a phase of the biasing high frequency power so as to delay the phase of the biasing high frequency power with respect to the phase of the high frequency power supplied to the plasma generating electrode.

Preferably, in the plasma processing apparatus, the phase controller in the plasma generation high frequency power supply unit controls the plasma generating high frequency power to be supplied to the plasma generating electrode so as to make a phase of the plasma generating high frequency power identical to a phase of the biasing high frequency power.

More preferably, in the plasma processing apparatus, the plasma generation high frequency power supply unit forms a high frequency power of a continuous wave as the plasma generating high frequency power to be supplied to the plasma generating electrode.

Also preferably, in the plasma processing apparatus, the plasma generation high frequency power supply unit forms a high frequency power of a continuous wave as the plasma generating high frequency power to be supplied to the plasma generating electrode, and the bias high frequency power supply unit forms a high frequency power pulse train as the biasing high frequency power to be supplied to the lower electrode, the phase controller controlling a phase of the high frequency power pulse train to be supplied to the lower electrode.

Yet preferably, the plasma processing apparatus further comprises a controller for controlling an ON/OFF duty ratio of the biasing high frequency power pulse train.

Yet further preferably, in the plasma processing apparatus, the plasma generating high frequency power unit forms a high frequency power pulse train as the plasma generating high frequency power to be supplied to the plasma generating electrode, and the phase controller controls a phase of the high frequency power pulse train to be supplied to the plasma generating electrode.

Preferably, in the plasma processing apparatus, the phase controller of the bias high frequency power supply unit controls the biasing high frequency power pulse train such that the biasing high frequency power pulse train has a predetermined delay with respect to the plasma generating high frequency power pulse train.

It is preferable that in the plasma processing apparatus, the bias high frequency power supply unit reduces a power value of the biasing high frequency power pulse train during an after glow period of pulse plasma.

It is also preferable that in the plasma processing apparatus, the bias high frequency power supply unit forms a biasing high frequency power pulse train which has a pulse width wider than a pulse width of the plasma generating high frequency power pulse train, and has a decreased power value during an after glow period of pulse plasma.

According to a second aspect of the invention, there is provided a plasma processing apparatus comprising:

a plasma processing chamber;

a plasma generating electrode located in the plasma processing chamber;

a phase detecting circuit for detecting a phase of a high frequency power to be supplied to the plasma generating electrode;

a plasma generation high frequency power supply unit for supplying a plasma generating high frequency power to the plasma generating electrode;

a lower electrode located in the processing chamber for mounting thereon a to-be-processed object; and a bias high frequency power supply unit for supplying a biasing high frequency power to the lower electrode, the bias high frequency power supply unit having a phase controller for controlling a phase of the biasing high frequency power so as to delay the phase of the biasing high frequency power with respect to the phase of the high frequency power supplied to the plasma generating electrode.

Preferably, in the plasma processing apparatus, the bias high frequency power supply unit supplies the lower electrode with a high frequency power having the same frequency as that of the plasma generating high frequency power to be supplied to the plasma generating electrode.

Also preferably, in the plasma processing apparatus, the phase controller of the bias high frequency power supply unit controls a phase of the biasing high frequency power to reduce the degree of hunting that occurs between the plasma generating high frequency power to be supplied to the plasma generating electrode and the biasing high frequency power.

Further preferably, in the plasma processing apparatus, the bias high frequency power supply unit forms and supplies a high frequency power pulse train as the biasing high frequency power to be supplied to the lower electrode, and the phase controller controls a phase of the high frequency power pulse train to be supplied to the lower electrode.

Yet further preferably, the plasma processing apparatus further comprises a controller for controlling an ON/OFF duty ratio of the biasing high frequency power pulse train.

Moreover, it is preferable that in the plasma processing apparatus according to the first or second aspect, the plasma generating electrode located in the plasma processing chamber is a parallel plate electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are timing charts for controlling the antenna division type RF induction plasma processing apparatus to which the basic concept of the present invention is applied.

DETAILED DESCRIPTION OF THE INVENTION

A plasma processing apparatus of the present invention can be applied to various plasma processes.

Figure 1:
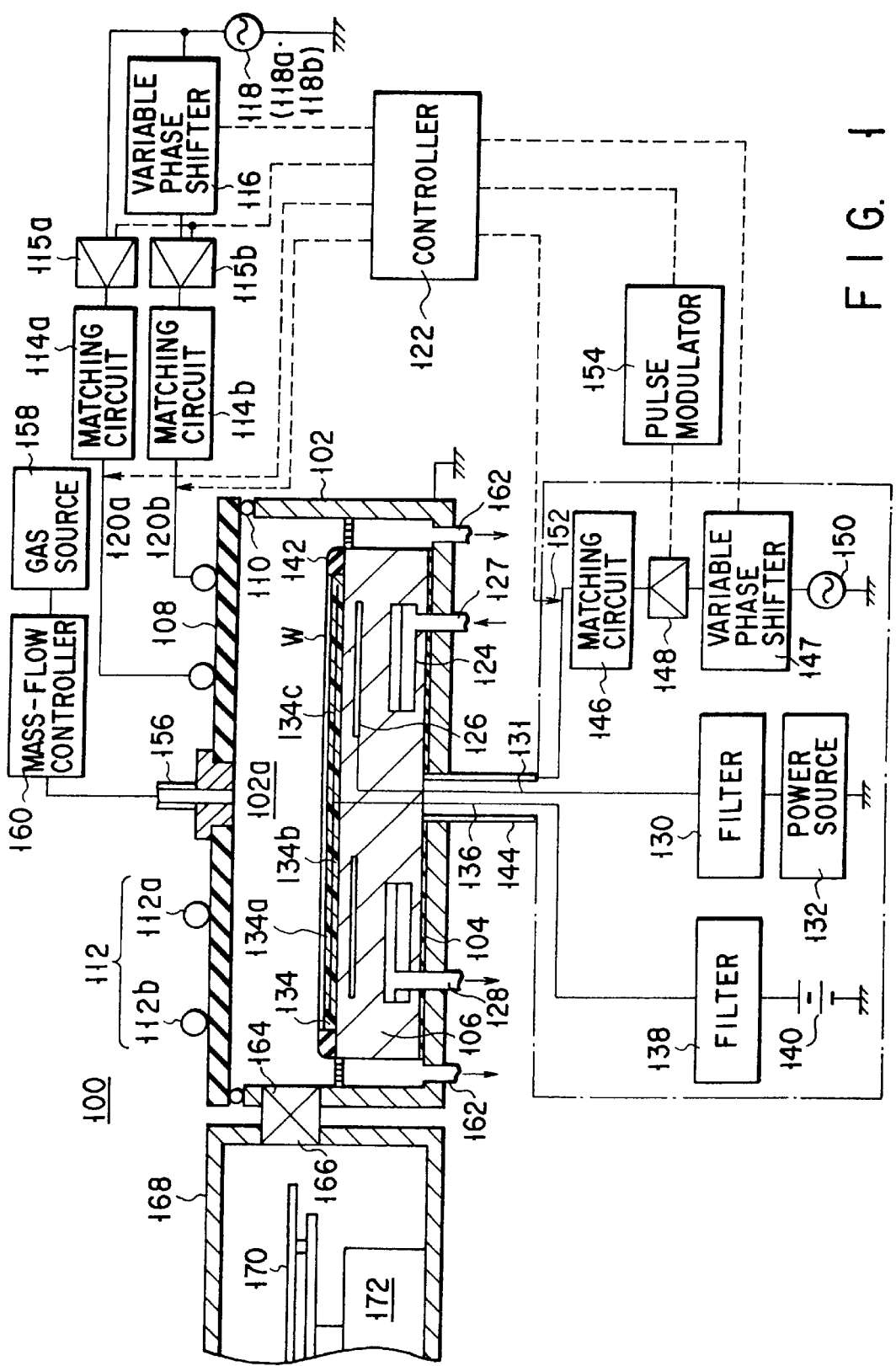
FIG. 1 is a sectional view showing the schematic arrangement of an antenna division type RF induction plasma processing apparatus to which the basic concept of the present invention is applied.

An embodiment in which the basic principle of the present invention is applied to an antenna division type RF induction plasma etching apparatus (TCP) 100 will be described with reference to FIG. 1.

A processing vessel 102 of the plasma etching apparatus 100 is made of a conductive material, e.g., aluminum, and is formed into a cylindrical shape or a rectangular cylindrical shape. The processing vessel 102 incorporates a processing chamber 102a wherein plasma etching is performed.

The processing vessel 102 is grounded, and has a susceptor 106 at its bottom portion. A substrate, e.g., a semiconductor wafer W is placed on the susceptor 106 via an insulating plate 104 such as a ceramic plate. An insulator 108 is airtightly arranged via a seal member 110 such as an O-ring at the top plate portion, of the processing vessel 102, opposing the susceptor 106. The insulator 108 is made of, e.g., silica glass or a ceramic. An RF antenna 112 (112a, 112b) formed into a loop shape is arranged on the outer wall surface of the insulator 108. The RF antenna 112 is made of a conductor such as a copper plate, aluminum, or stainless steel. The antenna 112 (112a, 112b) has only a function of generating a plasma by the antenna action. The antenna shape is not limited to the loop shape, and various shapes can be employed.

Figure 2:
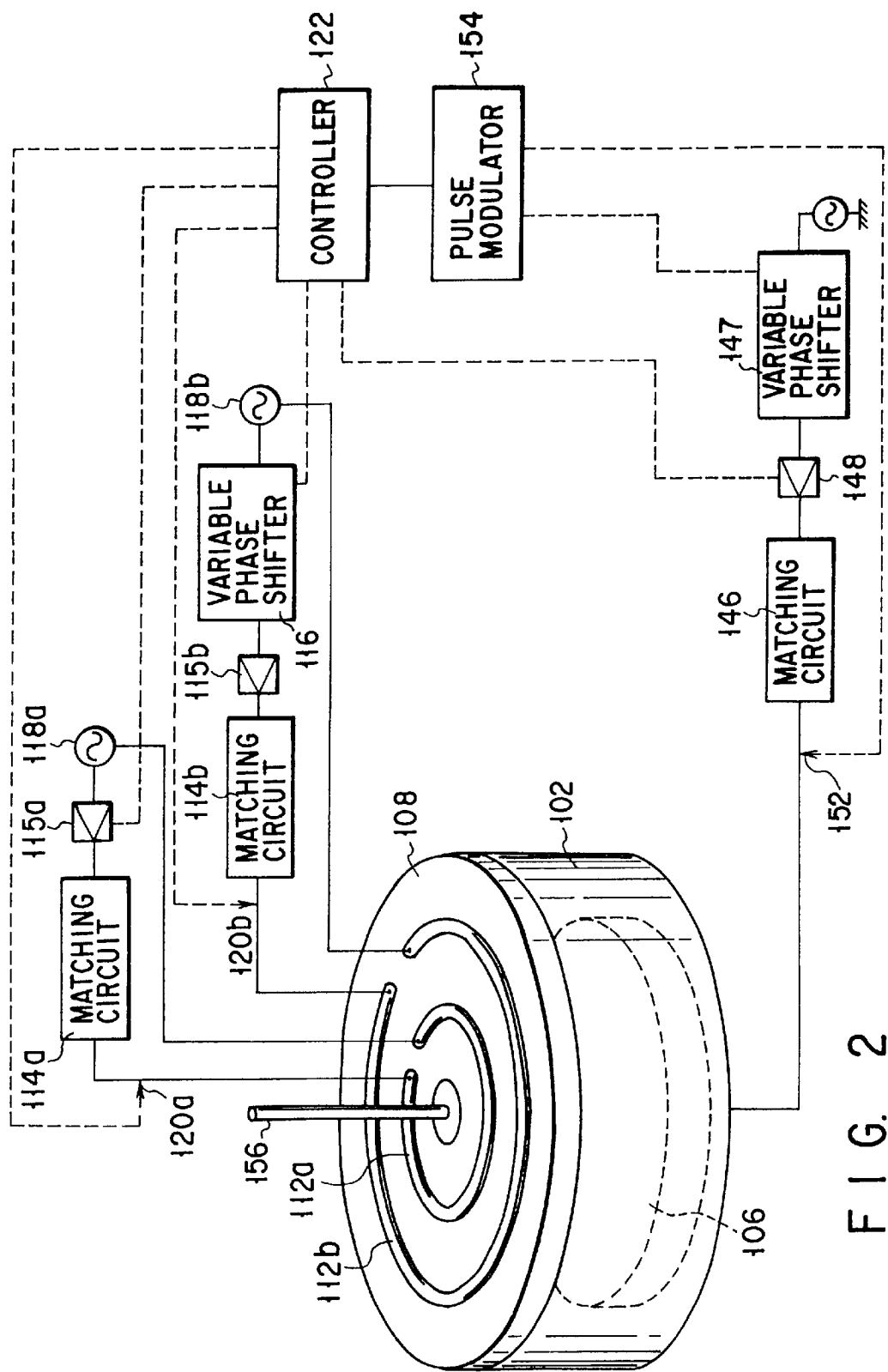
FIG. 2 is a schematic perspective view of the plasma processing apparatus shown in FIG. 1.

Referring to FIG. 2, the RF antenna 112 is constituted by a first RF antenna 112a arranged near the center on the outer wall surface of the insulator 108, and a second RF antenna 112b arranged around the first RF antenna 112a at a predetermined interval. The layout of the RF antenna 112 is not limited to a concentric layout like the one shown in FIG. 2, and various layouts can be employed. For example, one antenna of the RF antenna 112 may be arranged on the outer wall surface of the insulator 108, whereas the other may be arranged on the outer side surface of the processing vessel 102.

Referring back to FIG. 1, each of the RF antennas 112a and 112b is connected to an RF power supply unit constituted by a matching circuit 114 (114a, 114b), an amplifier 115 (115a, 115b), a variable phase shifter 116, and an RF power supply 118 (118a, 118b). The phases of RF powers to be applied to the respective RF antennas 112a and 112b can be controlled by the variable phase shifter 116.

The plasma etching apparatus 100 has phase detection circuits 120a and 120b on the output side of the matching circuit 114 (114a, 114b).

To uniformly generate a plasma by optimizing the plasma density/distribution in the plasma etching apparatus 100, the phases of the RF powers to be applied to the respective RF antennas 112a and 112b must be controlled to prevent mutual interference of electromagnetic fields formed by the first and second RF antennas 112a and 112b. However, even if the variable phase shifter 116 adjusts the phases of the RF powers, the phases of the RF powers to be applied to the respective RF antennas 112a and 112b slightly shift to fail to obtain desired phases because of the difference between the lengths of wires respectively connecting the RF power supplies 118a and 118b to the RF antennas 112a and 112b, and the influence of an electrical circuit arranged midway along the wire.

In the plasma etching apparatus 100, the phases of the RF powers are detected by the phase detection circuits 120a and 120b arranged on the output side of the matching circuit 114 (114a, 114b), and the variable phase shifter 116 is controlled by a controller 122 on the basis of the detected values, thereby setting the phases of the RF powers to predetermined values.

Referring back to FIG. 1, the susceptor 106 can be constituted by assembling a plurality of members formed of aluminum or the like with bolts or the like. The susceptor 106 incorporates temperature adjustment means such as a cooling means 124 and a heating means 126 to adjust the processing surface of the semiconductor wafer W at a desired temperature.

The cooling means 124 is constituted by, e.g., a cooling jacket. A coolant, e.g., liquid nitrogen is introduced into this cooling jacket through a coolant inlet pipe 127. The introduced liquid nitrogen circulates in the cooling means 124 to generate cooling heat upon nucleus boiling. With this arrangement, e.g., −196° C.—cooling heat of the liquid nitrogen conducts from the cooling means 124 to the semiconductor wafer W via the susceptor 106 to cool a processing surface F of the semiconductor wafer W to a desired temperature. Nitrogen gas generated upon nucleus boiling of the liquid nitrogen is exhausted outside the vessel through a coolant outlet pipe 128.

The susceptor 106 has the heating means 126. The heating means 126 is constituted by inserting a conductive resistance heating member made of, e.g., tungsten in an insulating sintered member made of, e.g., aluminum nitride. The resistance heating member receives a power from a power source 132 via a filter 130 and a power supply lead 131, and generates heat to heat the processing surface of the semiconductor wafer W to a desired temperature.

An electrostatic chuck portion 134 for holding the substrate is arranged at the center of the upper surface of the susceptor 106. The diameter of the chuck portion is almost equal to, and preferably, slightly smaller than that of the semiconductor wafer W. The electrostatic chuck portion 134 is constituted by interposing a conductive film 134c such as a copper foil between two films 134a and 134b consisting of a polymeric insulating material such as a polyimide resin. A voltage supply lead 136 connects the conductive film 134c to a variable DC voltage source 140 via a filter 138 for cutting an RF frequency. A high voltage of, e.g., 2 kV is applied to the conductive film 134c to chuck the semiconductor wafer W on the upper surface of the upper film 134a by the coulombic force.

An annular focus ring 142 is arranged around the susceptor 106 to surround the semiconductor wafer W. The focus ring 142 is made of an insulating or conductive material which does not attract reactive ions in the plasma. By the focus ring 142, the reactive ions in the plasma can be effectively injected into the semiconductor wafer W inside the focus ring 142.

The susceptor 106 is connected to a hollow conductive feeding bar 144. The feeding bar 144 is connected to a bias RF power supply unit constituted by a matching circuit 146, an amplifier 148, and an RF power supply 150.

In plasma processing, a predetermined frequency, e.g., an RF power of 2 MHz is applied to the susceptor 106. A bias potential is generated between the susceptor 106 and the plasma in the processing chamber 102a to effectively attract the reactive ions in the plasma to the processing surface of the substrate.

A phase detector 152 is set on the output side of the matching circuit 146. The phase detector 152 detects the phase of the current of the RF power to be applied to the susceptor 106. On the basis of this detection value, the controller 122 controls a variable phase shifter 147 to control the phase of the current of the bias RF power.

A pulse modulator 154 having functions of setting the duty ratio and delaying the phase is connected to the amplifier 148. In plasma processing, a bias RF power pulse-modulated within the range of, e.g., 1 Hz to 1 MHz is applied to the susceptor 106 in accordance with the plasma generation RF power (continuous RF power or RF power pulse train) to be applied to the first and second RF antennas 112a and 112b.

A processing gas supply port 156 is formed in the central portion of the insulator 108 above the susceptor 106. A processing gas such as $C_4F_8$ gas or Ar gas is introduced from a gas source 158 into the processing chamber 102a via a mass-flow controller 160.

An exhaust pipe 162 is connected to the bottom portion of the processing vessel 102 to exhaust the gas in the processing vessel 102 by an evacuating means (not shown) such as a vacuum pump. The atmosphere in the processing chamber 102a is evacuated to a low-pressure atmosphere of, e.g., 20 mTorr or less.

A substrate load/unload port 164 is formed in the side portion of the processing vessel 102. The load/unload port 164 communicates with a load-lock chamber 168 via a gate valve 166. The gate valve 166 is automatically opened/closed by a driving mechanism (not shown). A transport mechanism 172 is set in the load-lock chamber 168. Semiconductor wafers W are loaded by the transport mechanism 172 into the processing vessel 102 one by one.

When plasma processing is performed in the plasma processing apparatus 100, RF powers are applied to the first and second RF antennas 112a and 112b to form RF electromagnetic fields in the processing chamber 102a. Due to the electromagnetic fields, electrons in the processing gas collide with neutral particles to ionize the processing gas, thereby generating a plasma.

When a bias RF power is applied to the susceptor 106, a bias potential is generated between the plasma and the susceptor 106 to effectively draw reactive ions in the plasma into the substrate.

Process control in various modes in the plasma processing apparatus 100 will be explained below.

(1) When the RF power of continuous waves is applied to the RF antenna 112, each of the phase detectors 120a and 120b detects the phase of the current of the RF power. The controller 122 controls the variable phase shifter on the basis of the detected phase. As a result, the phase of the current is controlled to optimally generate an RF electromagnetic field in the processing chamber 102a.

A phase shift between the RF antennas 112a and 112b can be controlled by the controller 122 to avoid or reduce the interference phenomenon between the first and second RF antennas 112a and 112b.

When a bias frequency power having the same frequency as that for the plasma generation RF antennas 112a and 112b is applied to the lower electrode 106, the first and second RF antennas 112a and 112b are balanced with the bias to avoid or reduce the interference.

When an RF power pulse train is applied to the lower electrode, if the ON/OFF duty ratio and application power of the pulse are optimally controlled, the deposition time of etching radical species to the wafer W during the OFF period, and the ion impact time of the etching radical species to the wafer w during the ON period can be discriminately controlled. As a result, control of the etching shape and control of the selectivity are improved. Since the potential of the plasma during the OFF period becomes lower than that during the ON period, charge-up can also be controlled.

Depending on an etching target, the etching gas, the doping gas, or the bias frequency must be changed to change the priority of process factors such as the etching shape, rate, and selectivity.

In these cases, the pulse modulator 154 performs pulse modulation control to apply, to the lower electrode 106, an RF power pulse train having a frequency different from that for the first and second RF antennas 112a and 112b. By optimizing the duty ratio and application power of the RF power pulse train, control of the etching shape for the substrate, and control of the selectivity can be improved, as described above.

(2) Case Wherein RF Power Pulse Train is Applied to RF Antenna

The density of negative ions in the plasma, and the etching time can be controlled by applying a plasma generation RF power pulse train to the first and second RF antennas 112a and 112b.

In this case, an RF power pulse train formed by pulse modulation control is applied to the lower electrode 106.

The dissociated state of the gas in the plasma changes depending on the ON and OFF periods of the plasma generation RF power pulse train. To realize a desired etching selectivity and etching shape, the bias RF power pulse train is controlled to draw etchants in accordance with a period when many preferable etchants exist. For example, to draw a moderate after glow plasma into the target processing surface, a method of delaying the RF power pulse train to be applied to the lower electrode 106, or a method of widening the pulse width of the RF power pulse train can be employed, as shown in FIGS. 3A and 3B.

In the after glow period, the plasma density rapidly decreases. When a bias power having the same power as that in the main plasma generation period is applied to the lower electrode, a sheath voltage for drawing the after glow plasma abruptly rises to damage the substrate. To avoid or reduce this phenomenon, a method of reducing the bias power to a predetermined value on the basis of a preset sequence in the after glow period, or a method of changing the bias power in accordance with changes in plasma density during the after glow period can be employed.

As described above, the deposition time to the wafer W and the ion impact time to the wafer W can be discriminately controlled by optimally controlling the ON/OFF duty ratio and application power of the RF power pulse train to be applied to the lower electrode. As a result, control of the etching shape and control of the selectivity are improved. Since the potential of the plasma in the OFF period becomes lower than that in the ON period, charge-up can be reduced by controlling the ON/OFF duty ratio of the RF power pulse.

Figure 4:
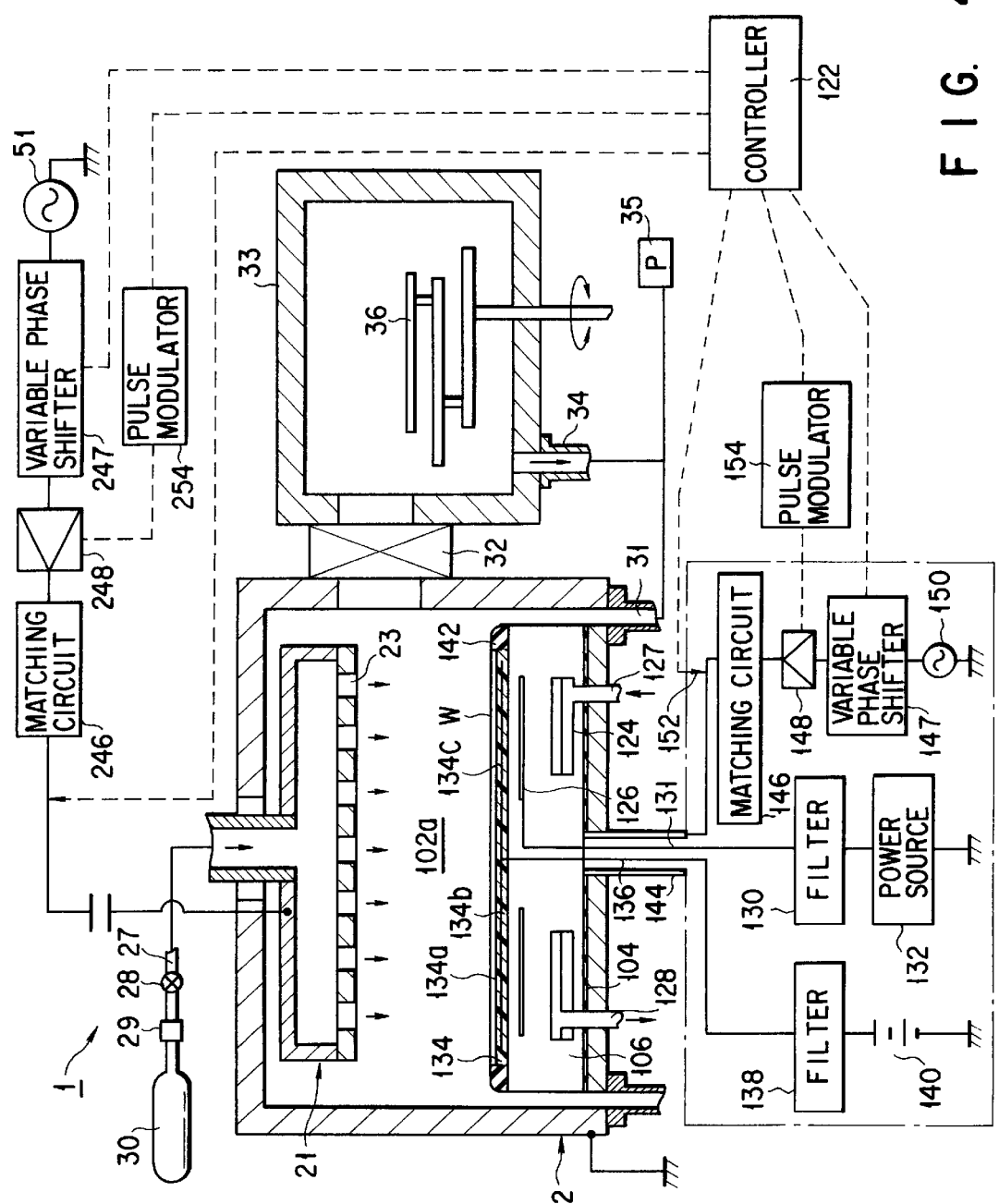
FIG. 4 is a sectional view illustrating a parallel plate electrode plasma processing apparatus to which the basic concept of the present invention is applied.

Referring now to FIG. 4, a description will be given of a plasma processing apparatus having a plasma generating electrode in its plasma processing chamber, according to an embodiment to which the basic principle of the invention is applied. A parallel plate electrode plasma processing apparatus is employed as the plasma processing apparatus of this embodiment.

In a chamber 2 incorporated in an etching apparatus 1 shown in FIG. 4, an upper electrode (shower electrode) 21 and a lower electrode (susceptor) 106 are opposed to each other. The chamber 2 can have a cylindrical structure formed of, for example, an aluminum plate coated with anodized aluminum. The process chamber 2 is grounded. The susceptor is insulated from the process chamber 2 by means of an insulating plate 104.

The susceptor 106 can contain cooling means 124. The cooling means 124 is formed of, for example, a cooling jacket, into which a coolant, e.g. liquid nitrogen, is introduced via a coolant introducing pipe 127. The introduced liquid nitrogen circulates in the cooling means 124, and generates cold as a result of nucleate boiling. By virtue of this structure, the cold of liquid nitrogen of, for example, −196° C. is transmitted from the cooling means 124 to a semiconductor wafer W through the susceptor or mount table 106. The to-be-processed surface F of the semiconductor wafer W is cooled to a desired temperature. Nitrogen gas resulting from the nucleate boiling of liquid nitrogen is exhausted to the outside of the chamber through a coolant exhaustion pipe 128.

The mount table 106 has heating means 126. The heating means 126 can have a structure in which a conductive heating resistor formed of, for example, tungsten is inserted in an insulating sintered body formed of, for example, aluminum nitride. Power is supplied from a power supply 132 to the heating resistor via a filter 130 and a power supply lead 131, whereby the heating resistor is heated to thereby heat the semiconductor wafer W to a desired temperature.

The susceptor 106 is formed such that an upper central portion thereof slightly projects. An electrostatic chuck section 134 is provided on the susceptor 106. It is preferable that the electrostatic chuck section 134 has a structure in which a conductive film 134c made of, for example, copper foil is held between two films 134a and 134b that are formed of a high polymer insulating material made of polyimide resin. The conductive film 134c is connected to a variable DC voltage source 140 via a voltage supply lead 136 and a filter 138 for cutting high frequency. When a high voltage of, for example, 2 kV has been applied to the conductive film 134c, the semiconductor wafer W is attached to the upper surface of the upper film 134a by coulombic energy.

An annular focus ring 142 is provided around the mount table 106 to surround the semiconductor wafer W. The focus ring 142 may be formed of an insulating or conductive material which will not attract reactive ions contained in plasma. The focus ring 142 enables effective application of the reactive ions in plasma to the semiconductor wafer W located within the ring.

The lower surface of the upper electrode 21 is separated by about 80–5 mm from the upper surface of the susceptor 106. The upper electrode 21 is supported by an upper wall portion of the process chamber 2 via an insulating material 22 interposed therebetween. Multiple gas discharge holes 23 are formed in the lower surface of the upper electrode 21 for discharging an etching gas therethrough to the wafer W. An electrode plate 24 formed of, for example, SiC or amorphous carbon is supported at a lower portion of the upper electrode 21 by means of a member 25. The member 25 is coated with anodized aluminum.

A gas inlet 26 is formed in a central portion of the member 25, and connected to a gas supply 30 via a pipe 27. A valve 28 and a mass flow controller 29 are attached to the pipe 27. The gas supply 30 contains etching gases such as $CF_4$ gas, $C_4F_8$ gas, $Cl_2$ gas, etc.

A load lock chamber 33 is located adjacent to the processing chamber 2 via a gate valve 32. An exhaust pipe 31 is connected to the processing chamber 2, while an exhaust pipe 34 is connected to the load lock chamber 33. The exhaust pipes 31 and 34 are connected to a turbo molecule pump 35 for reducing the pressure in the processing chamber 2 and the load lock chamber 33 to 10–300 m Torr. The load lock chamber 33 contains transfer means 36 having an arm for transferring the wafer W between the processing chamber 2 and the load lock chamber 33.

A hollow conductive feeder rod 144 is connected to the mount table 106, and also to a bias RF power unit consisting of the matching circuit 146, an amplifier 148 and an RF power supply 150.

During plasma processing, an RF power with a predetermined frequency of, for example, 2 MHz is applied to the mount table 106. As a result, a bias potential is created between the mount table 106 and plasma in the processing chamber 102a, thereby enabling effective application of the reactive ions to the to-be-processed surface of the object.

A phase detector 152 is located at the output side of the matching circuit 146. The phase detector 152 detects the phase of the current of the RF power applied to the lower electrode 106. On the basis of this detection value, a controller 122 controls a variable phase shifter 147 to thereby control the phase of the current of a biasing RF power.

The amplifier 150 is connected to a pulse modulator 154 that has a function for setting a duty ratio and delaying a phase. During plasma processing, a biasing RF power subjected to pulse modulation within a range of, for example, 1 Hz–1 MHz is applied to the mount table 106 in accordance with a plasma generating RF power (a continuous RF power or an RF power pulse train) applied to first and second RF antennas 112a and 112b.

The etching apparatus 1 has two RF power supplies 51 and 150.

The first RF power supply 51 applies to the upper electrode 21 an RF power with a high frequency of, for example, 13.56 MHz. The first RF power supply 51 is connected to the upper electrode 21 via a capacitor 52, and also grounded. This plasma generating circuit is called a "P-mode circuit".

It is optimal to set, at 13.56 MHz, the frequency fl of the RF power applied from the first RF power supply 51. Further, it is preferable to set the frequency fl at a value falling within the range of 10 Hz–100 MHz. A matching circuit 246, an amplifier 248 and a variable phase shifter 247 are connected between the first RF power supply 51 and the capacitor 52. The variable phase shifter 247 can control the phase of the RF power applied to the upper electrode 21.

The etching apparatus 1 has a phase detecting circuit 252 at the output side of the matching circuit 246. To uniformly generate plasma by optimizing the plasma-density/distribution in the etching apparatus 1, it is necessary to control the RF power applied to the upper electrode 21 so as to have a predetermined phase difference between itself and the RF power applied to, for example, the lower electrode 106.

However, even if the variable phase shifter 247 adjusts the phase of the RF power, it is difficult to obtain a desired phase difference, since the phase of the RF power applied to the upper electrode will slightly vary due to a difference in length between the wires that connect the upper electrode to the RF power supply 51, or due to the influence of the electric circuits that are provided across the wires. To solve this problem, in the etching apparatus 1, the phase of the RF power applied to the upper electrode is detected by the phase detecting circuit 252 located at the output side of the matching circuit 246, and the variable phase shifter 247 is controlled by the controller 122 on the basis of the detection value, thereby setting the phase difference between the RF powers at a predetermined value.

Descriptions will be given of process control that is performed in various modes using the plasma processing apparatus 1, to etch a silicon oxide film ($SiO_2$) on a silicon wafer W.

(1) Where an RF power in the form of a continuous wave is applied to the upper electrode 21 from the RF power supply 51:

A wafer W is transferred by the transfer means 36 from the load lock chamber 38 into processing chamber 2 and then onto the susceptor 106. The wafer W is electrostatically held by the electrostatic chuck section 134. The pressure in the processing chamber 2 is reduced to a predetermined degree of vacuum. $CF_4$ gas is introduced from the gas supply 30 into an upper space in the upper electrode 21 through the pipe 27 and the gas inlet 126, and uniformly discharged onto the wafer W through the discharge holes 23. The mass-flow controller 29 adjusts the flow of the coolant gas supplied from the gas supply 30.

After the pressure in the processing chamber 2 reaches, for example, 10 mTorr, an RF power is applied to the upper electrode from the first RF power supply 51, whereby $CF_4$ gas is converted into plasma between the upper electrode and the susceptor 106.

An RF power pulse train (of, for example, 380 kHz) is applied to the susceptor or lower electrode 106 from the second RF power supply 150. As a result, ions or radical species such as fluorine radicals, which are contained in the plasma, are attracted by the susceptor 106, thereby etching the silicon oxide film on the wafer W.

Adjusting the frequency of the biasing RF power applied to the lower electrode 106 to the same value as that of the RF power applied from the first RF power supply 51 for generating plasma balances the lower and upper electrodes with each other, with the result that interference therebetween can be avoided or minimized.

When an RF power pulse train is applied to the lower electrode, if the ON/OFF duty ratio and application power of the pulse train are optimally controlled, the period during which etching radical species are deposited on the wafer W during the OFF period of the pulse train, and the period during which ions impact against the wafer W during the ON period of the pulse train can be individually controlled. As a result, the controllability of the etching shape and the controllability of the selectivity are improved. Since the potential of the plasma during the OFF period is lower than that during the ON period, charge-up can also be controlled.

Depending on an etching target, the etching gas, the doping gas, or the bias frequency must be changed to change the priority of process factors such as the etching shape, rate, and selectivity.

In those cases, the pulse modulator 154 performs pulse modulation control, and applies, to the lower electrode 106, an RF power pulse train of a frequency different from those of the RF power pulse trains applied to the first and second RF antennas 112a and 112b. As described above, the controllability of the etching shape and the controllability of the selectivity can be improved by optimizing the duty ratio or the application power of the RF pulse train applied to the lower electrode.

(2) Where an RF power pulse train is applied to the upper electrode:

Application of an RF power pulse train to the upper electrode enables the concentration control of negative ions in plasma or the control of the etching time.

In this case, an RF power pulse train created by the pulse modulation control is applied to the lower electrode. The gas dissociation state in the plasma differs between the ON and OFF periods of the plasma generating RF power pulse train. To achieve a desired etching selectivity and etching shape, the biasing RF power pulse train is controlled, when a great amount of a preferable etchant exists, so as to pull the etchant to the lower electrode 106. For example, as shown in FIGS. 3A and 3B, a method for delaying the RF power pulse train applied to the lower electrode 106, or a method for widening the pulse width of the RF power pulse train can be used to apply moderate after glow plasma to the to-be-processed surface of an object.

During the after glow period of the plasma, the plasma density quickly reduces. If the same biasing power as that applied during the main plasma generating period has been applied to the lower electrode, the sheath voltage for pulling the after glow plasma increases quickly, which will damage the object. To avoid or reduce the damage, there can be employed a method for reducing the biasing power to a predetermined value in accordance with a preset sequence of operations during the after glow period, or a method for varying the biasing power in accordance with changes in plasma density during the after glow period.

Further, as in the case (1), the period during which etching radical species are deposited on the wafer W during the OFF period of the pulse train, and the period during which ions impact against the wafer W during the ON period of the pulse train can be individually controlled by optimally controlling the ON/OFF duty ratio or the application power of the RF power pulse train applied to the lower electrode. As a result, the controllability of the etching shape and the controllability of the selectivity are improved. Moreover, since the potential of the plasma during the OFF period is lower than that during the ON period, charge-up can also be controlled by controlling the ON/OFF duty ratio of the RF power pulse train.

As described above, in the present invention, the control of the phases of RF powers to be applied to the RF antennas and the lower electrode, and/or the pulse modulation control of those powers can improve the uniformity degree of plasma generated in the processing chamber, prevent hunting between divided antenna components, enhance the generation efficiency of plasma, and easily and accurately control the etching selectivity or the etching shape.

In the apparatus shown in FIG. 4, the use of an RF power with a high frequency supplied from the first RF power supply 51 enables the generation and maintenance of stable high-density plasma. Since radical species contained in the plasma are controlled by an RF power which is applied to the lower electrode 106 and different from the power from the first RF power supply 51, wafers w can be etched with high selectivity. Further, since ions cannot follow an RF wave with a high frequency of 3.56 MHz for generating plasma, wafers W will not be damaged even if the output of the RF power supply 51 is increased to obtain high density plasma.

Other advantages and changes of the present invention will be apparent to those skilled in the art.

For example, although the present invention has been described using the parallel plate plasma generating apparatus as an embodiment, it is not limited to the embodiment, but also applicable to any plasma processing apparatus having a plasma generating electrode provided in a plasma processing chamber. It is apparent that this application is included in alterations or modifications that fall within the scope of the claimed technical idea, and therefore that the application does not depart from the technical scope of the present invention.

In addition, although the embodiment shown in FIG. 4 is an example in which the invention is applied to an etching apparatus, the invention is not limited to the etching apparatus, but also applicable to various types of plasma processing apparatuses such as an ashing apparatus, a film forming apparatus, a sputtering apparatus, etc.

Moreover, the plasma processing apparatus of the invention can process, as well as semiconductor wafers, various types of to-be-processed objects that need plasma processing, e.g. a glass substrate for a liquid crystal display apparatus.

The spirit and scope of the present invention are not limited to the detailed description, the illustrated embodiment and its description in this specification, and is interpreted within the widest scope of the inventive concept defined in the following claims. Therefore, the present invention can be variously changed without departing from the scope of the inventive concept defined in the following claims, and the scope of a concept equivalent thereto.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing apparatus comprising:
   a plasma processing chamber;
   a plasma generating electrode located in the plasma processing chamber;
   a phase detecting circuit configured to detect a phase of a plasma generating high frequency power to be supplied to the plasma generating electrode;
   a plasma generation high frequency power supply unit configured to supply a high frequency power pulse train as the high frequency power to the plasma generating electrode, the plasma generation high frequency power supply unit having a phase controller configured to control the phase of the high frequency power supplied to the plasma generating electrode;
   a lower electrode located in the processing chamber and configured to mount thereon a to-be-processed object; and
   a bias high frequency power supply unit configured to supply a high frequency power pulse train as a biasing high frequency power to the lower electrode, the bias high frequency power supply unit having a phase control mechanism configured to control a phase of the biasing high frequency power so as to delay the phase of the biasing high frequency power with respect to the phase of the high frequency power supplied to the plasma generating electrode to draw a moderate after glow plasma onto a surface of the object to-be-processed.

2. An apparatus according to claim 1, further comprising a controller configured to control an ON/OFF duty ratio of the biasing high frequency power pulse train.

3. An apparatus according claim 1, wherein the bias high frequency power supply lit reduces a power value of the biasing high frequency power pulse train during an after glow period of pulse plasma.

4. An apparatus according claim 1, wherein the bias high frequency power supply unit forms a biasing high frequency power pulse train which has a pulse width wider than a pulse width of the plasma generating high frequency power pulse train, and has a decreased power value during an after glow period of pulse plasma.

5. An apparatus according to claim 1 or, wherein the plasma generating electrode located in the plasma processing chamber is a parallel plate electrode.

6. A plasma processing apparatus comprising:
   a plasma processing chamber;
   a plasma generating electrode located in the plasma processing chamber;
   a phase detecting circuit configured to detect a phase of a plasma generating high frequency power to be supplied to the plasma generating electrode;
   a plasma generation high frequency power supply unit configured to supply a high frequency power pulse train as the high frequency power to the plasma generating electrode;
   a lower electrode located in the processing chamber and configured to mount thereon a to-be-processed object; and
   a bias high frequency power supply unit configured to supply a high frequency power pulse train as a biasing high frequency power to the lower electrode, the bias high frequency power supply unit having a phase controller configured to control a phase of the biasing high frequency power so as to delay the phase of the biasing high frequency power with respect to the phase of the high frequency power supplied to the plasma generating electrode to draw a moderate after glow plasma onto a surface of the object to-be-processed.

7. An apparatus according to claim 6, wherein the bias high frequency power supply unit supplies the lower electrode with a high frequency power having the same frequency as that of the plasma generating high frequency power to be supplied to the plasma generating electrode.

8. An apparatus according to claim 6, wherein the phase controller of the bias high frequency power supply unit controls a phase of the biasing high frequency power to reduce the degree of hunting that occurs between the plasma generating high frequency power to be supplied to the plasma generating electrode and the biasing high frequency power.

9. An apparatus according to claim 6, further comprising a controller configured to control an ON/OFF duty ratio of the biasing high frequency power pulse train.

* * * * *